United States Patent [19]

Bloy et al.

[11] Patent Number: 4,695,825
[45] Date of Patent: Sep. 22, 1987

[54] ANALOG-DIGITAL CONVERSION SYSTEM

[75] Inventors: Graham P. Bloy, St. Louis, Mo.; John L. Miramonti, County of Oakland, Mich.

[73] Assignee: Metme Communications, St. Louis, Mo.

[21] Appl. No.: 856,832

[22] Filed: Apr. 28, 1986

[51] Int. Cl.$^4$ ............................................. H03M 1/02
[52] U.S. Cl. ........................ 340/347 SH; 340/347 C
[58] Field of Search ..... 340/347 AD, 347 C, 347 SH; 377/50

[56] References Cited

U.S. PATENT DOCUMENTS 4,496,937  1/1985  Kitagawa et al. ............ 340/347 AD Primary Examiner—Bernard Roskoski
Assistant Examiner—Richard K. Blum
Attorney, Agent, or Firm—Kalish & Gilster

[57] ABSTRACT

An analog-digital conversion system is used with a microprocessor having an algorithm by which digital signal processing is carried out by the microprocessor. The A/D conversion system converts analog signals to offset binary form for processing by the microprocessor during repetitive cycles of operation. The conversion system includes a sample-and-hold (S/H) circuit for periodically sampling the value of the analog input and an A/D converter for converting sampled input into the digital format. Timing circuitry of the system generates a plurality of control signals during each such cycle of operation. Such timing circuitry controls the S/H circuit, the A/D converter and the microprocessor, as well as a D/A converter which reconverts the processed data into analog format. Logic circuitry selectively shortens the duration of at least one interval associated with the control signals to reduce overall processing duration. Such reduction is carried out by shortening a successive timing state, and also by employing clock circuitry which switches between two different clock rates. Real-time digital processing of voice signals by the microprocessor is made possible.

12 Claims, 2 Drawing Figures

ANALOG-DIGITAL CONVERSION SYSTEM

BACKGROUND AND SUMMARY OF THE INVENTION

This invention relates to circuitry for converting analog signals to and from digital form, and, more particularly, to circuitry for facilitating such conversion at relatively high speed such as for use in digital signal processing systems.

In the conversion of analog signals to digital form such as particularly when the data is in serial form, there are time delays associated with clocking the data into and out of devices such as holding registers and the like. In digital processing systems in which analog data must be converted to a digital format before and after digital processing, the delays associated with conversion between serial and parallel formats degrade overall system performance by resulting in an undesirably long total processing interval. For example, an analog-to-digital (A/D) conversion of the signal to be processed must first occur. An appropriate interval for such conversion must be allocated during the processing cycle. A further delay is then utilized for transferring data serially into the digital processor circuitry. After processing, the data must then be transferred into a digital-to-analog (D/A) converter for conversion to the analog form for further processing or other purposes.

Accordingly, it is desired in such processing systems to minimize the conversion time as well as the associated data clocking intervals, data transmitting intervals, and other necessary delays and to achieve a minimum overall cycle period, whereby the overall processing time will be shortened, leading to greater processing bandwidth and capacity.

There have been proposed heretofore various high speed conversion schemes. Thus, for example, it is possible to utilize various exotic conversion techniques including so-called flash converters. Another possibility is the conversion of input data into parallel data streams with simultaneous parallel signal processing of the several streams. However, all such schemes having suffered from complexity and high cost, do not permit widespread commercial usage where simplicity and economy are needed. Further, if a single microprocessor is to be utilized for implementing a digital signal processing algorithm, data input must be provided.

Accordingly, among the several objects of the invention may be noted the provisions of improved analog-digital conversion system; the provision of such a system which includes improved A/D as well as D/A conversion; which minimizes processing intervals associated with A/D conversion; which allows overlapped A/D and D/A conversion coupled with processing greatly minimizing overall cycle times associated with such conversion; and which, when utilized with a digital signal processing system, brings about overall cycle times of markedly reduced interval for enhancing processing rates and increasing bandwidth; which provides for increased Nyquist frequency of analog-digital conversion; and which eliminates wasted or excessive "wait" periods during operation of the system and processing circuitry which may be utilized with the conversion system.

It is further an object of the invention to provide an analog-digital conversion system providing an increased speed of conversion of analog input signals to a serial digital data stream for digital processing of such data by use of a microprocessor for implementing a digital signal processing algorithm to provide real-time processing of the datastream, and for providing rapid accurate conversion of the processed digital signal into an analog output signal for further use.

It is a further object of the invention to provide such a conversion system which is simply and economically configured thereby to permit widespread commercial adoption of the system, including direct incorporation of the system as in the form of a large scale integrated circuit (LSI) device into various types of commercial and consumer equipment such as microphones, amplifiers, radio receivers, modulators, modulator-demodulators (modems), transmitters and transceivers, and portable or hand-held units; and which may be incorporated into other integrated circuit devices.

It is also an object of the invention to provide such a conversion system which can be used for conversion of various kinds and forms of analog signals into digital format for further processing with or without further conversion of the processed signals into analog or other formats.

Other objects and aspects of the invention will be apparent or are set forth below.

DESCRIPTION OF THE PREFERRED EMBODIMENT

Figure 1:
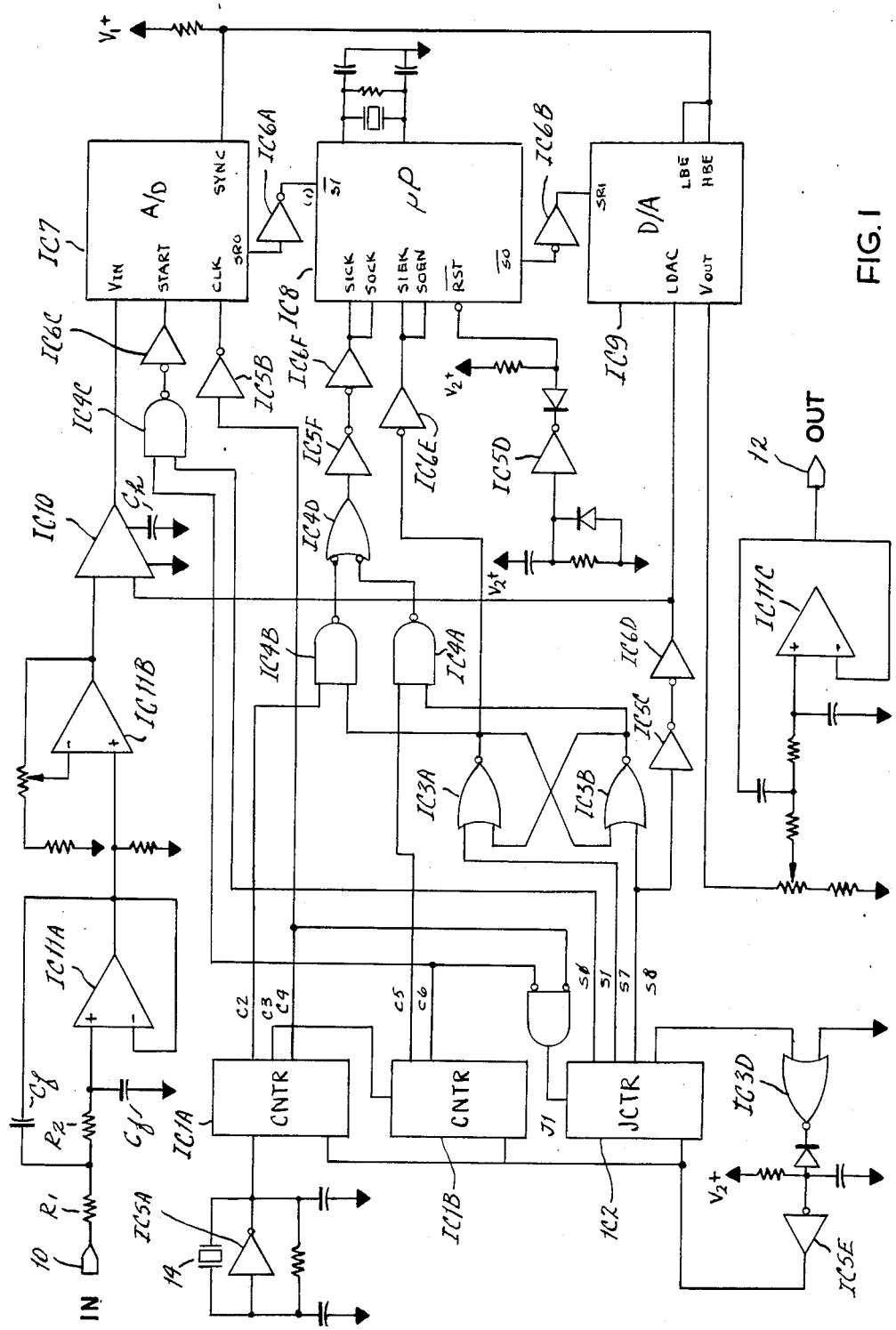
FIG. 1 is a schematic circuitry diagram of a digital signal processing system including an analog-digital conversion system in accordance with the invention for providing both A/D and D/A conversion, for implementing operation of the digital signal processing system.

Referring to FIG. 1, a digital signal processing system includes an analog-digital conversion system, and is constituted by integrated circuits which carry the general designations IC1–IC10 but some of which have distributed components such as IC1A and IC1B which are both 4-bit binary up counters. Others such as IC2 are self-contained, the latter being a 10-state Johnson-type counter.

IC3 is used to designate a quad 2-input NOR gate circuit, of which the individual NOR gates are designated IC3A–IC3D. Similarly IC4A–IC4D designates individual NAND gates of Schmitt trigger type, while IC5A–IC5F are individual logic inverters of a hex inverter device IC5.

IC7 designates an integrated circuit analog-to-digital (A/D) converter while IC8 designates a microprocessor utilized for implementing a digital signal processing algorithm. IC9 is a digital-to-analog (D/A) converter of integrated circuit type.

The designation IC10 refers to an integrated circuit sample-and-hold (S/H) device. IC11A–IC11D refers to integrated circuit operational amplifiers provided on a single IC (integrated circuit) device.

Such devices IC1–IC11 are each of suitable commercially available type as may be selected by those skilled in the art for their own purposes.

Various power supply, voltage reference and other connections for conditioning or grounding of IC pins not used, or to be held always low or always high are not shown for the sake of simplicity, being all within the knowledge of those skilled in the art.

The circuitry of FIG. 1 carries out three phases of processing: (1) Digitizing, by which there is A/D conversion of an analog signal provided by an input 10 into serial data; (2) Processing by use of an appropriate algorithm resident in memory of IC8; and (3) Reconversion, by which there is D/A conversion of the processed digital signal into analog format provided to an output 12.

By appropriate timing, such three phases may be implemented simultaneously by overlapped sequencing (pipelining). Thus, the input signal is sampled by S/H device IC10, digitized by A/D operation of converter IC7 and provided through inverter IC6A to microprocessor IC8 for digital processing. During such processing, a subsequent sample held by IC10 is digitized by IC7. The processed signal is then clocked through inverter IC6B to converter IC9 for reconversion to an analog value. During such reconversion, a third sample is digitized and so forth. Such operation will be more readily understood by reference to FIG. 2 which is a timing diagram showing the levels of various signals as a function of time and wherein CLK designates a clock signal which is derived by a binary count signal C4 whch is provided through inverter IC5B to an input designated CLK of converter IC7. It should be noted that counter IC1A is clocked by a crystal oscillator including a crystal 14 and inverter IC5A and related resistance and capacitors, for providing a master time base signal C0.

Figure 2:
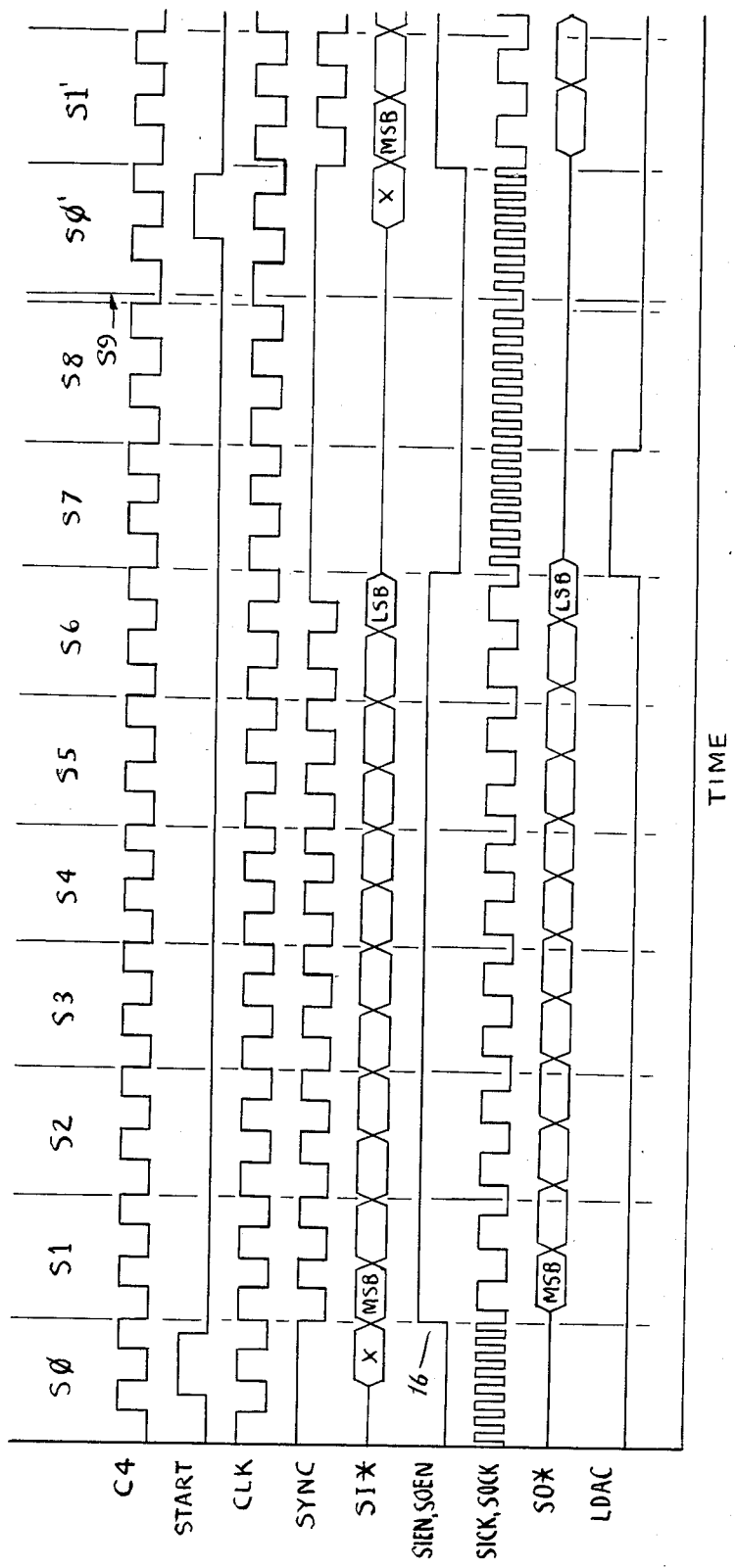
FIG. 2 is a timing diagram relative to the operation of the system of FIG. 1.

Counter output C3 provides a count input for counter IC1B, the binary outputs of which are C5, C6, with C4 and C5 being in quadrature. C4 and C6 are provided to inputs of IC3C which provides an output signal J1 serving as input to Johnson counter IC2. The latter is a five-stage decade counter with included code converter to define and identify ten states, with changes of state occurring on the positive-going edge of J1. Each of the first nine states are of the same period approximately (8 μsec) and a tenth state being far shorter (1 μsec) because of reset circuitry later described. The ten states are identified S0–S9, being asserted sequentially as shown in FIG. 2.

Signals S0 and C6 are provided to the inputs of gate IC4C, the output of which is inverted by inverter IC6C to provide a signal START to A/D converter IC7. This signal starts an A/D conversion at the appropriate point in the cycle. The signal CLK provided as earlier described is used by IC7 to perform the A/D conversion and is also used by IC7 to derive a signal SYNC. This signal, as appropriately biased by positive supply voltage $V_1$, is provided to D/A converter IC9 by connection to LBE and HBE (Low and High Bit Enable) inputs. After a conversion is initiated by signal START, converter IC7 begins outputting valid data during state S1. It begins with MSB (Most Significant Bit) and follows with successively lower order bits until reaching LSB (Least Significant Bit).

Analog data input is presented to an input of IC7 designated $V_{in}$, as the output of S/H IC10.

The microprocessor IC8 is here assumed to be the type which requires offset binary data in two's complement form, and inverter IC6A is used to invert the data stream provided as an input to the microprocessor and to provide level shifting. The signal input is designated SI with translation of the offset binary form into two's complement form being performed by the microprocessor. In addition to such input to be processed, control signals for the microprocessor include SICK (Serial Input Clock), SIEN (Serial Input Enable), and such signals are required to clock in the data stream. Similarly, control signals SOCK (Serial Output Clock) and SOEN (Serial Output Enable) are used for clocking out the data following processing. In FIG. 2, the serial input data is designated SI*. In FIG. 2, it is also seen that SIEN and SOEN are provided by the same signal; and similarly SICK and SOCK are provided by the same signal.

The signals SIEN and SOEN are provided by the output of inverter IC6E in response to operation of interconnected NOR gates IC3A, IC3B which together form a reset-set (R-S) logic latch. Timing signal S1 is used to set this latch and signal S7 to reset it. Consequently, the signal provided at the output of IC3B is the same as SIEN-SOEN. The signal at the output of IC3A is, on the other hand, the complement of SIEN-SOEN. This signal is provided, as noted above, to IC6E to form the signal SIEN-SOEN by inversion. Such signal is required to indicate to the microprocessor that valid data is present on the serial input data line. The rising edge of this signal, as designated at 16 in FIG. 2 is interpreted by the microprocessor causing it to clock in 16 bits of data from A/D converter IC7. For purposes of economy, A/D converter IC7 has a limited highest clock rate such as, for example, 250 Khz. Thus, to clock in 12 bits would require 48 microsec However, microprocessor IC8 is here assumed to be of the type requiring 16 clocks or 64 microsec. Such period is excessive and would cause limiting of the bandwidth of the system. In order to speed processing time, therefore, 12 data bits are clocked in at 250 Khz and 4 null bits are clocked in at a much greater speed, such as one MHZ, whereby the total time for clocking data into the microprocessor is 52 microsec. For this purpose, gates IC4A, IC4B, IC4D, IC5F and IC6F constitute a two-speed serial clock to enable a shorter overall cycle time. Consequently, the signal SICK has a slower pulse repetition rate shown during timing states S1–S6 and a pulse repetition rate shown during timing states S7–S0.

Such operation occurs as follows: timer output C5 is used to derive the slower (250 Khz) portion of SICK-SOCK. Counter output signal C2 is used to derive the higher speed portion (one MHZ) portion of SICK-SOCK. The signals at the output of gate IC3A are used to turn C2 and C5 on and off, with gate IC4B being used as a switch for a signal for C2 and IC4A being used as a switch for signal C5, which is provided to the input of gate IC4A. The other input of IC4A is provided from the output of gate IC3B. The output of NAND gate IC4A is accordingly high whenever A/C converter IC7 is outputting valid data and during which the lower speed clock is requisite. When the output of this NAND gate (IC4A) is high, the low speed clock is "off". Counter signal C2 is provided to one of the inputs of NAND gate IC4B. This gate also receives as an input the output signal of gate IC3A of the R-S latch. This output is high whenever the A/D converter IC7 is not outputting valid data corresponding to a need for a high speed clock. If the corresponding signal provided to gate IC4B is high, the signal at the output of gate IC4B constitutes the complement of the signal provided at the output of gate IC3B, so that the high speed clock signal is then "on". Thus also, if the output of gate IC3A is low, then the output of gate IC4B is high so that the high speed clock is then "off".

In view of the foregoing, only one of two clocks, either C2 or C5, can be "on" at any time, so that the output of gate IC4D will be either the C2 clock or the C5 clock. It will be noted that inverter IC6F is used to complement and level shift the logic level of the clock thus provided and supply such signal as SICK and SOCK to microprocessor IC8. When such signals are both received by the microprocessor, the data stream designated SO* in FIG. 2 is provided as an output and complemented by IC6B for input as a serial data stream to D/A IC9. The signal SO* is in offset binary form, MSB first, with negative logic; hence IC6B provides positive logic to obtain serial input to the D/A converter. Such data is clocked into the register thereof on the leading edges of the signal SYNC, which is provided as an output from A/D converter IC7. Normally, such signal is of tri-state character, but a resistor connected between the output for this signal and the supply voltage $V_1$ keeps SYNC in a high state when there is a high impedance condition of such output. When the data bits are loaded into the input register of D/A IC9, signal LDAC is assorted to load the data from the input register for conversion by D/A IC9 into an analog voltage to provide an output which is designated $V_{out}$.

Observe that LDAC is actually the signal S7 and is also used to control S/H circuit IC10. The latter has two modes, tracking and holding. In its tracking mode, the S/H output follows its input. In the hold mode, the output of the S/H becomes the value of the input voltage at the time of invoking the hold mode. In the circuitry illustrated, it is preferred that S/H circuit IC10 track the input only when LDAC is high. However, when LDAC goes low, IC10 enters its hold mode for holding the output voltage as above described. A capacitor $C_h$ stores the voltage output of IC10 when in its hold mode.

Counters IC1A, IC1B and IC2 are all reset by circuitry including NOR gate IC3D and inverter IC5E in response to timing state S8. The resistor-capacitance circuit between these two gates establishes a voltage at the input of gate IC5E by causing such capacitance to be charged to the supply voltage $V_2$, so that normally the output of IC5E is low, permitting each of these counters to be enabled for counting. In this condition, it is assumed that timing signal S9 is low. However, when S9 is asserted, the diode at the output of IC3D is forward biased by the output of IC3D going low. Such diode rapidly discharges the capacitance, forcing the output of IC5E to be high. This action resets each of the counters. When counter IC2 is reset, S9 is taken low, once more asserting timing state S0. Such resetting occurs in a very short duration, such as about 1 microsec. The shortened timing state S9 which results is shown in FIG. 2 and further shortens the overall cycle interval substantially with the same advantage as the use as above described two-speed clock. Such shortened cycle time provides greater system bandwidth by enabling sampling of the next analog input to occur more rapidly than otherwise would be the case. Consistent with the timing state S9 being shortened to about 1 microsec., the time constant of the resistive-capacitive circuit at the input of IC5E is of the same duration. It will be manifest that because of this time constant, charging of the capacitor at the input IC5E occurs in a shortened interval of time but, when the input of IC5E goes high because of charging, its output goes low enabling each of counters IC1A, IC1B and IC2 to begin counting again and such signals the beginning of a cycle and the initiation of timing state S0, as designated at S0' in FIG. 2.

Inverter IC5D is similarly interconnected with a resistive-capacitive circuit and is interconnected through a diode, as indicated, to an input of microprocessor IC8 designated RST. Such resistive-capacitive circuit provides a short time delay when power is applied to the system, such as about 1 msec. in order to provide a power-on-reset signal to the microprocessor.

In addition to the circuitry above described, the system of the invention includes anti-alias filters. A first such filter is provided in the input stages of the system and is constituted by an integrated circuit 11A which is provided with a feedback capacitance $C_f$ and other resistive-capacitive elements $R_1$, $R_2$ and $C_b$ which are of values selected for providing a two-pole response characteristic appropriate for filtering out alias components associated with the operation of the A/D converter IC7. The output of IC11A is provided to a variable gain stage comprised of IC11B which is utilized for matching input level provided by the signal at input 10 to the digitizing levels of the system as determined by the characteristics of A/D converter IC7.

Similarly, the output of the system includes a similar anti-alias filter in the form of operational amplifier IC11C which also is of two-pole character. Use of such anti-alias filters prevents out-of-band signals. If, for example, a sampling frequency of 16 kHz is used, the Nyquist theorum dictates that the maximum band pass of the present processing system will be less than or equal to one-half the sampling frequency, i.e., will be approximately 8 kHz. Accordingly, the anti-alias filters are used to filter out any component greater than about 7.8 kHz. It is preferred to obtain attenuation characteristics, accordingly, which are sufficient for preventing such alias frequencies from being present in the processed data. For this purpose, an attention characteristic of 16 or more db/octave for the anti-alias filters is most preferred. If necessary, such filters may be replaced by four-pole Butterworth or eliptical type for enhanced attenuation.

The present system allows rapid A/D conversion of a real-time analog signal, processing of the signal in digital format by operation of microporcessor IC11B which implements a digital processing algorithm, and reconversion of the processed signal into analog form. The extremely high speed of conversion permits digital signal processing of an audio signal, such as that utilized in radio frequency transmission, modulation, audio equipment and numerous other types of devices and systems. Further, operation of the system is not limited to the real-time digital conversion and processing of a voice signal, but can be applied also to various other kinds of signals and data. By the use of the two-speed clock as above described, and the circuitry for obtaining shortened timing state S8, the new system is caused to operate at a far higher conversion and processing cyclic rate than would otherwise be obtainable, thereby effecively increasing the bandwidth of the system and allowing digital processing of analog signals which otherwise could not be processed on a real-time basis. Thus, by more rapid A/D conversion and loading into the microprocessor IC8 of successive samples of the analog signal, greater time is afforded for digital processing by the microprocessor than otherwise would be available whereby to permit a relatively complex algorithm to be carried out by the microprocessor. In the case of voice signals, the new conversion system thus makes possible, for the first time, real-time digital processing of an entirely novel character.

Although the foregoing includes the description of the best mode of the emobidments contemplated for carrying out the invention, various modifications are contemplated. For example, the present circuitry may be hybridized or entirely produced in LSI (Large Scale Integrated Circuit) form without departing from the principles of the invention. Thus also, the system may be directly incorporated into other systems and circuitry.

What is claimed is:

1. In an analog-digital conversion system for receiving analog input signals and converting such input signals to digital form for further processing by digital processing apparatus during repetitive cycles including a sample-and-hold circuit for periodically sampling the value os such input signals and an analog-to-digital converter for converting the sampled input signals into digital format, the improvement characterized by timing circuitry for generating a plurality of control signals during each such cycle for controlling the sample-and-hold circuit, the analog-to-digital converter and the processing apparatus, said timing circuitry comprising means for selectively shortening the duration of at least one interval associated with such control signals, the timing circuitry comprising an oscillator and resettable counter means driven by the oscillator for proving counter output defining a plurality of successive timing states which together define each such repetitive cycle, the means for selectively shortening duration comprising means responsive to count signal output of the counter means for resetting of the counter means for accelerated termination of the last timing state in each such cycle, whereby to reduce average total duration of each such cycle by accelerating the beginning of each such cycle.

2. In an analog-digital conversion system according to claim 4, the improvement further characterized by said counter means comprising at least a first counter for generating clock signals and a further counter responsive to outputs of first counter for generating signals representing said timing states, the resetting means being responsive to outputs of the further counter.

3. In an analog-digital conversion system according to claim 2, the improvement further characterized by the resetting means including a logic gate and a resistive-capacitance circuit defining a time constant for determining a shortened duration of the last timing cycle.

4. In an analog-digital conversion system according to claim 2, the improvement further characterized by the first counter having count inputs defining a plurality of clock signals at different rates, the means for selectively shortening duration comprising logic circuitry responsive to the count outputs of the second counter for selecting predetermined ones of the clock signals during different timing states, and circuit means for supplying the selected clock signals to the digital processing apparatus during different timing states, whereby to reduce the overall duration of each cycle.

5. In an analog-digital conversion system according to claim 4, the improvement further characterized by the first and second counters comprising respectively a binary counter and a Johnson-type counter.

6. In an analog-digital conversion system according to claim 4, the improvement further characterized by the digital processing apparatus comprising a microprocessor, the selected clock signals providing clocking of digital data into and out of the microprocessor.

7. In an analog-digital conversion system according to claim 6, the improvement further characterized by a digital-to-analog converter controlled also by the timing circuitry for receiving digital data clocked out of the microprocessor and for converting such data into analog format.

8. In an analog-digital conversion system for receiving analog input signals and converting such input signals to digital form for further processing by digital processing apparatus during repetitive cycles including a sample-and-hold circuit for periodically sample the value of such input signals and an analog-to-digital converter for converting the sampled input signal into digital format, the improvement characterized by timing circuitry for generating a plurality of control signals during each such cycle for controlling the sample-and-hold circuit, the analog-to-digital converter and the processing apparatus, said timing circuitry comprising means for selectively shortening the duration of at least one interval associated with such control signals, whereby to reduce average total duration of each such cycle, by the digital processing apparatus comprising a microprocessor for implementing a digital signal processing algorithm to digitally process the sampled input signals.

9. In an analog-digital conversion system according to claim 8, the improvement further characterized by a digital-to-analog converter controlled also by the timing circuitry for receiving the digitally processed signal from the microprocessor and for converting such data into an analog format output signal.

10. In an analog-digital conversion system according to claim 9, the improvement further characterized by anti-alias filter means for filtering the analog input and output signal to filter out alias signals to prevent processing thereof.

11. In an analog-digital conversion system for receiving analog input signals and converting such input signals digital form for further processing by digital processing apparatus during repetitive cycles including a sample-and-hold circuit for periodically sampling the value of such input signals and an analog-to-digital converter for converting the sampled input signals into digital format, the improvement characterized by timing circuitry for generating a plurality of control signals during each such cycle for controllin g the sample-and-hold circuit, the analog-to-digital converter and the processing apparatus, including pulse generating circuitry for defining a plurality of successive identified timing states which together define each such repetitive cycle, means responsive to the occurrence of said successive timing states for selectively shorting the duration of an interval associated with at least one of said successive timing states, whereby to reduce average total durating of each such cycle.

12. In an analog-digital conversion system according to claim 11, the improvement further characterized by the timing circuitry comprising an oscillator and resettable counter means driven by the oscillator for providing count output defining a plurality of successive timing states which together define each such repetitive cycle, the means for selectively shortening duration comprising means responsive to count signal outputs of the counter means for resetting of the counter means for accelerated termination of the last timing state in each such cycle, whereby to accelerate the beginning of each such cycle.

* * * * *

UNITED STATES PATENT AND TRADEMARK OFFICE
CERTIFICATE OF CORRECTION

PATENT NO. : 4,695,825

DATED : September 22, 1987

INVENTOR(S) : Graham P. Bloy and John L. Miramonti

It is certified that error appears in the above-identified patent and that said Letters Patent is hereby corrected as shown below:

Column 7, line 18 - "os" should be -- of --
Column 7, line 32 - "output" should be -- outputs --
Column 8, line 13 - "sample" should be -- sampling --
Column 8, line 15 - "signal" should be -- signals --
Column 8, line 40 - after "nals" and before "digital" insert -- to --
Column 8, line 47 - "controllin g" should be -- controlling --
Column 8, line 53 - "shorting" should be -- shortening --

Signed and Sealed this

Twelfth Day of April, 1988

Attest:

DONALD J. QUIGG

Attesting Officer

Commissioner of Patents and Trademarks